US010015028B2

(12) United States Patent
Jorgensen et al.

(10) Patent No.: US 10,015,028 B2
(45) Date of Patent: Jul. 3, 2018

(54) SYSTEM AND METHOD FOR CONTROLLING PEAK TO AVERAGE POWER RATIO

(71) Applicant: TEXAS INSTRUMENTS INCORPORATED, Dallas, TX (US)

(72) Inventors: Lars Jorgensen, Royal Oaks, CA (US); Zigang Yang, Plano, TX (US); Hardik Prakash Gandhi, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 393 days.

(21) Appl. No.: 14/492,839

(22) Filed: Sep. 22, 2014

(65) Prior Publication Data
US 2015/0085748 A1 Mar. 26, 2015

Related U.S. Application Data

(60) Provisional application No. 61/880,375, filed on Sep. 20, 2013.

(51) Int. Cl.
*H04W 4/00* (2018.01)
*H04L 27/08* (2006.01)
*H04L 1/00* (2006.01)
*H03F 1/32* (2006.01)
*H03F 3/24* (2006.01)
*H04L 27/34* (2006.01)
*H04W 52/52* (2009.01)
*H04W 52/04* (2009.01)

(52) U.S. Cl.
CPC ........... *H04L 27/08* (2013.01); *H03F 1/3241* (2013.01); *H03F 3/245* (2013.01); *H04L 1/0041* (2013.01); *H04L 1/0045* (2013.01); *H04L 27/3411* (2013.01); *H03F 2200/435* (2013.01); *H04W 52/04* (2013.01); *H04W 52/52* (2013.01)

(58) Field of Classification Search
None
See application file for complete search history.

(56) References Cited

U.S. PATENT DOCUMENTS 8,189,455 B1 * 5/2012 Ma .................. H04J 11/0023
370/208
2002/0168013 A1 * 11/2002 Attallah ............ H04L 27/2614
375/259

(Continued)

*Primary Examiner* — Bob Phunkulh
(74) *Attorney, Agent, or Firm* — Kenneth Liu; Charles A. Brill; Frank D. Cimino

(57) ABSTRACT

A system and method for reducing peak to average power ratio in a wireless communication system. A wireless communication system includes a radio frequency wireless transmitter that includes signal peak reduction circuitry configured to reduce peak to average power ratio of a signal to be transmitted by reducing amplitude of the signal to be transmitted that is greater than a predetermined amplitude. The signal peak reduction circuitry includes a bit inverter configured to invert a bit of a symbol identified as causing the amplitude of the signal to exceed the predetermined amplitude. The bit inverter is also configured to select the bit to invert such that inversion of the bit reduces the amplitude of the signal, and such that forward error correction in a receiver wirelessly coupled to the transmitter restores the bit to a pre-inversion value.

20 Claims, 3 Drawing Sheets

(56) References Cited

U.S. PATENT DOCUMENTS

| | | | |
|---|---|---|---|
| 2004/0218689 A1* | 11/2004 | Akhtman | H04L 27/2624 375/296 |
| 2006/0120269 A1* | 6/2006 | Kim | H04L 25/03866 370/208 |
| 2006/0215780 A1* | 9/2006 | Yeon | H04L 5/023 375/260 |
| 2007/0098094 A1* | 5/2007 | Yue | H04L 1/0043 375/260 |
| 2007/0254592 A1* | 11/2007 | McCallister | H03F 1/0205 455/67.11 |
| 2008/0056393 A1* | 3/2008 | Niu | H04L 27/2613 375/260 |
| 2009/0003308 A1* | 1/2009 | Baxley | H04B 1/59 370/350 |
| 2009/0080556 A1* | 3/2009 | Duan | H04L 27/2617 375/262 |
| 2010/0226449 A1* | 9/2010 | Ilow | H04L 27/2615 375/260 |
| 2011/0075745 A1* | 3/2011 | Kleider | H04L 25/03057 375/260 |
| 2012/0294346 A1* | 11/2012 | Kolze | H04L 27/3411 375/224 |
| 2012/0314750 A1* | 12/2012 | Mehrabani | H04L 27/01 375/229 |
| 2013/0185617 A1* | 7/2013 | Roh | H04W 4/00 714/800 |
| 2013/0322563 A1* | 12/2013 | Van Zelst | H04L 27/2621 375/295 |

\* cited by examiner

SYSTEM AND METHOD FOR CONTROLLING PEAK TO AVERAGE POWER RATIO

CROSS-REFERENCE TO RELATED APPLICATIONS

The present application claims priority to U.S. Provisional Patent Application No. 61/880,375, filed Sep. 20, 2013 entitled "Technique to Minimize Peak to Average Power Ratios for Communication Signals;" which is hereby incorporated herein by reference in its entirely.

BACKGROUND

Power amplifiers used for wireless communication are generally rated for a specified peak power that can be transmitted. The greater the difference of peak and average power (i.e., the higher the peak to average power ratio (PAPR)) of a signal to be transmitted, the lower the transmit power achieved by a given power amplifier. By reducing the PAPR, the average transmit power can be increased, which improves amplifier power efficiency.

SUMMARY

A system and method for reducing peak to average power ratio in a wireless communication system are disclosed herein. In one embodiment, a wireless communication system includes a radio frequency wireless transmitter. The transmitter includes signal peak reduction circuitry. The signal peak reduction circuitry is configured to reduce peak to average power ratio of a signal to be transmitted by reducing amplitude of the signal to be transmitted that is greater than a predetermined amplitude. The signal peak reduction circuitry includes a bit inverter. The bit inverter is configured to invert a bit of a symbol identified as causing the amplitude of the signal to exceed the predetermined amplitude. The bit inverter is also configured to select the bit to invert such that inversion of the bit reduces the amplitude of the signal to a level that does not exceed the predetermined amplitude, and such that forward error correction in a receiver wirelessly coupled to the transmitter restores the bit to a pre-inversion value.

In another embodiment, a method for reducing peak to average power ratio in a wireless communication system includes detecting amplitude values in a signal to be transmitted that exceed a predetermined amplitude. The method also includes inverting a bit of a symbol that is identified as causing the amplitude of the signal to exceed the predetermined amplitude. The bit to invert is selected such that: inversion of the bit reduces the amplitude of the signal, and such that forward error correction in a receiver wirelessly coupled to the transmitter that inverts the bit restores the bit to a pre-inversion value.

In a further embodiment, a transmitter for a wireless backhaul system includes signal peak reduction circuitry configured to reduce peak to average power ratio of a signal to be transmitted by reducing amplitude of the signal to be transmitted that is greater than a predetermined amplitude. The signal peak reduction circuitry includes an interpolator, a peak detector, and a bit inverter. The interpolator is configured to generate a representation of the signal to be transmitted based on the symbols to which the signal to be transmitted is mapped. The peak detector is configured to detect, based on the representation of the signal, amplitude values in the signal to be transmitted that exceed the predetermined amplitude. The bit inverter is configured to invert a bit of a symbol identified as causing the amplitude of the signal to exceed the predetermined amplitude. The bit inverter is also configured to select the bit to invert such that: inversion of the bit reduces the amplitude of the signal, and such that forward error correction in a receiver wirelessly coupled to the transmitter restores the inverted bit to a pre-inversion value.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

For point-to-point microwave or millimeter wave (mm-Wave) radios, such as wireless backhaul systems, reducing peak to average power ratio (PAPR) of a signal to be transmitted improves signal-to-noise ratio (SNR) at the receiver, resulting in more robust transmission and/or higher throughput rates. Microwave/mmWave backhaul systems may support large constellations (e.g., up to 4096 quadrature amplitude modulation (QAM) states) in order to maximize the system capacity in good channel conditions. The PAPR for such a signal can be as high as 10.5 dB for 4096 QAM. Such a large constellation may require about 55 dB of error vector magnitude (EVM) on the transmitted signal, where EVM is a measure of in-band signal to noise ratio. Conventional PAPR reduction algorithms fail to provide any PAPR reduction under such conditions.

Embodiments of the present disclosure reduce PAPR and for a given power amplifier can provide 1.5 dB or more of increased signal power without degrading EVM or introducing out of band noise. Embodiments reduce PAPR by inverting one or more bits within a symbol that causes a peak in a signal to be transmitted, where the peak exceeds a predetermined threshold amplitude.

Figure 1:
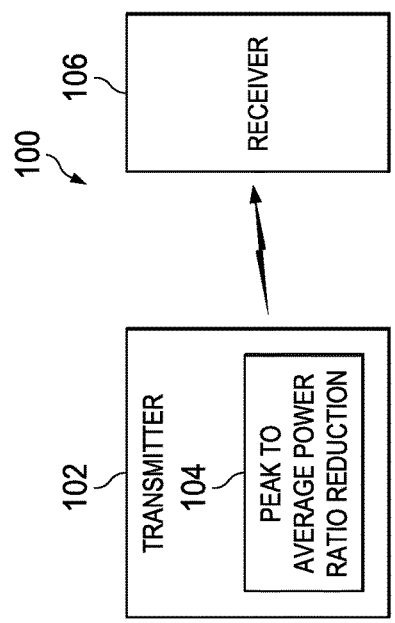
FIG. 1 shows a block diagram for a system for wireless communication in accordance with various embodiments.

FIG. 1 shows a block diagram for a system 100 for wireless communication in accordance with various embodiments. The system 100 includes transmitter 102 and receiver 106. The system 100 may be a backhaul system that transfers large amounts of data from the transmitter 102 at a remote site to the receiver 106 at a central site. The system 100 may transfer data using microware or millimeter wave carrier signals, and apply a large constellation (e.g. 4096 state quadrature amplitude modulation (4096 QAM)) to modulate transmitted signal and facilitate transfer of large quantities of data.

The transmitter 102 includes PAPR reduction circuitry 104. The PAPR reduction circuitry 104 reduces the PAPR of signal transmitted by the transmitter 102. By reducing the PAPR of transmitted signal, the PAPR reduction circuitry 104 increases the average power of transmitted signal, improves power amplifier power efficiency, and for the point-to-point microwave or millimeter wave communication employed by the system 100, provides improved signal-to-noise ratio at the receiver 106. As a result, the PAPR reduction circuitry 104 allows the system 100 to provide more robust transmission and/or higher throughput rates than conventional systems.

Figure 2:
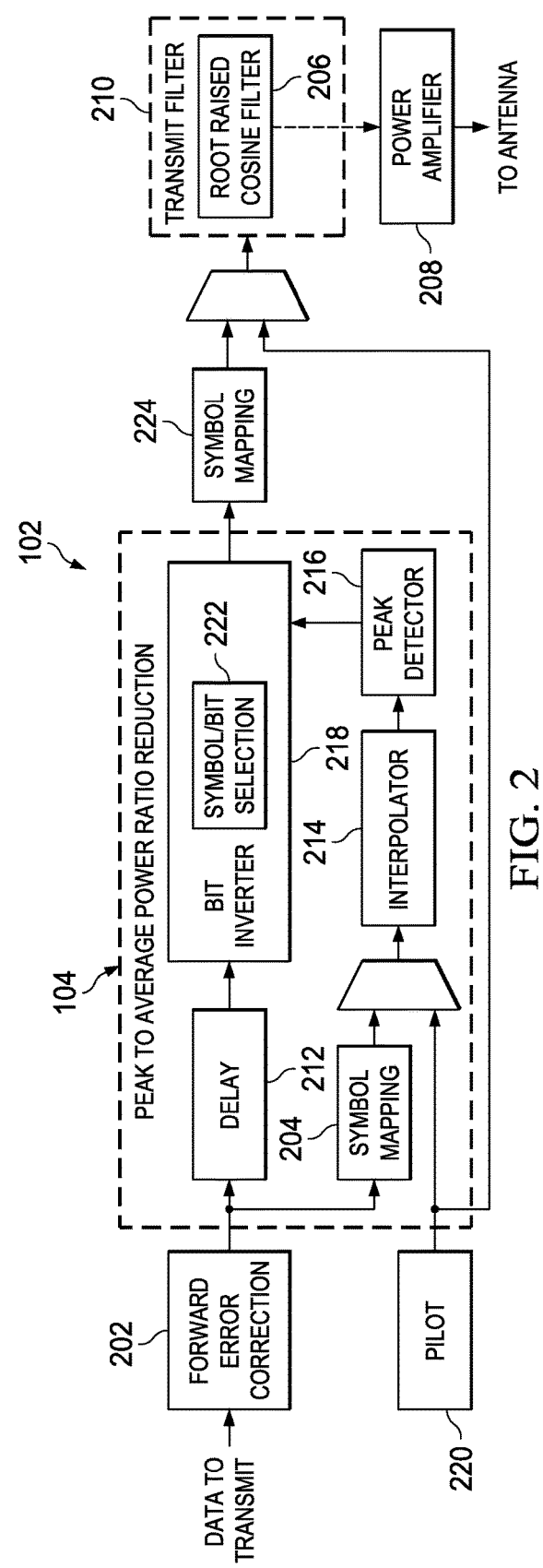
FIG. 2 shows a block diagram for a wireless transmitter that reduces peak to average power ratio of transmitted signal in accordance with various embodiments.

FIG. 2 shows a block diagram for the wireless transmitter 102 in accordance with various embodiments. The wireless transmitter 102 includes forward error correction logic 202, symbol mapping logic 224, PAPR reduction circuitry 104, a transmit filter 210, and a power amplifier 208. The transmitter 102 may include other components that have been omitted from FIG. 2 in the interest of clarity. For example, the transmitter 102 may include scrambling logic, predistortion circuitry, digital-to-analog conversion, etc. that are not shown in FIG. 2.

The forward error correction logic 202 adds error correction coding to data received for transmission (e.g., data received from medium access control logic). In some embodiments, the forward error correction logic 202 may add Bose-Chaudhuri-Hocquenghem (BCH) error correction codes to the data to be transmitted. In other embodiments, the forward error correction logic 202 may add low density parity codes (LDPC) to the data to transmitted in lieu of, or in addition to, BCH codes. Some embodiments may apply different and/or additional error correction coding to the data to be transmitted.

The forward error correction encoded data is provided to the PAPR reduction circuitry 104. The PAPR reduction circuitry 104 includes delay logic 212, symbol mapping logic 204, interpolator 214, peak detector 216, and bit inverter 218. The forward error correction encoded data provided to the PAPR reduction circuitry 104 is routed to symbol mapping logic 204 and delay 212. The symbol mapping logic 204 assigns complex symbols to the data bit sequences received from the forward error correction logic 202. For example, the symbol mapping logic 204 may assign a number of bits of data received from the forward error correction logic 202 to a point of a constellation (e.g., a 4096 QAM constellation).

The symbols generated by the symbol mapping logic 204 are provided to the interpolator 214. The interpolator 214 applies filtering and upsampling to the symbols received from the symbol mapping logic 204 to generate a representation of the signal to be transmitted, e.g., signal as seen by the power amplifier 208. The interpolator 214 may apply operations that approximate the effects of the transmit filter 210 on the signal to be transmitted.

The peak detector 216 receives the representation of the signal to be transmitted generated by the interpolator 214, and identifies peaks in the signal. More specifically, the peak detector 216 identifies peak signal amplitude values that exceed a predetermined amplitude threshold. The threshold may be set to identify peak amplitude values that are greater than a maximum peak amplitude value associated with a desired PAPR. The peak detector 216 notifies the bit inverter 218 of detected peak signal amplitudes that exceeds the threshold.

In order to limit the bit errors and/or other side effects introduced by the PAPR reduction process, the peak detector 216 may include windowing logic that applies a moving window to the interpolated signal. The window may be defined as a number of samples, a time interval, etc. Within the window, the peak detector 216 may select a single peak (e.g., the highest amplitude peak) for reduction. Thus, the peak detector 216 ensures that bit inversion is applied to only a single peak within the window.

The delay logic 212 stores the forward error correction encoded data for a time interval sufficient for processing of the symbols by the interpolator 214 and the peak detector 216.

In response to notification of a detected peak signal amplitude that exceeds the threshold, the bit inverter 218 identifies and inverts one or more bits, stored by the delay logic 212, that are associated with the peak signal amplitude. Inversion of the bit(s) reduces the amplitude of the peak detected by the peak detector 216 (e.g., to a value less than the threshold) thereby decreasing PAPR of the signal to be transmitted.

The bit inverter 218 includes symbol/bit selection logic 222 that selects, from among the symbols associated with a detected peak signal amplitude, a symbol in which one or more bits is to be inverted. The symbol selection logic may select the symbol nearest in time to the detected peak amplitude for inversion of a bit. In some embodiments, symbols proximate the peak are examined to determine which symbol includes a bit to be inverted to reduce the amplitude of the detected peak. In such embodiments, the symbols selected may include bit(s) that if inverted reduce or minimize the peak power of the signal, or alternatively, bit(s) that if inverted reduce or minimize the symbol power.

The bit inverter 218 may invert one or more bits per signal peak exceeding the threshold. Accordingly, the symbol/bit selection logic 222 selects, from among the bits of a selected symbol associated with a detected peak signal amplitude, one or more bits to be inverted. The bit selection logic may select a bit that if inverted maximizes reduction of peak amplitude of the signal to be transmitted. In some embodiments, the bit selection logic may select a bit that if inverted maximizes the distance between the original symbol containing the bit and the symbol produced as a result of inverting the bit. In some embodiments, the bit selection logic may select a bit that if inverted minimizes the amplitude of the symbol generated as a result of the inversion.

The symbol/bit selection logic 222 may also consider the error correction applied by the forward error correction logic 202 in selection of a bit to invert. Inversion of a bit in the error correction encoded data introduces an error into the transmitted data stream. The symbol/bit selection logic 222 may select a bit to invert that is likely to be detected and corrected by forward error correction logic in the receiver 106. Thus, PAPR reduction circuitry 104 operates in conjunction with the forward error correction applied to the transmitted signal to reduce PAPR without increasing bit or frame error rate.

Figure 3:
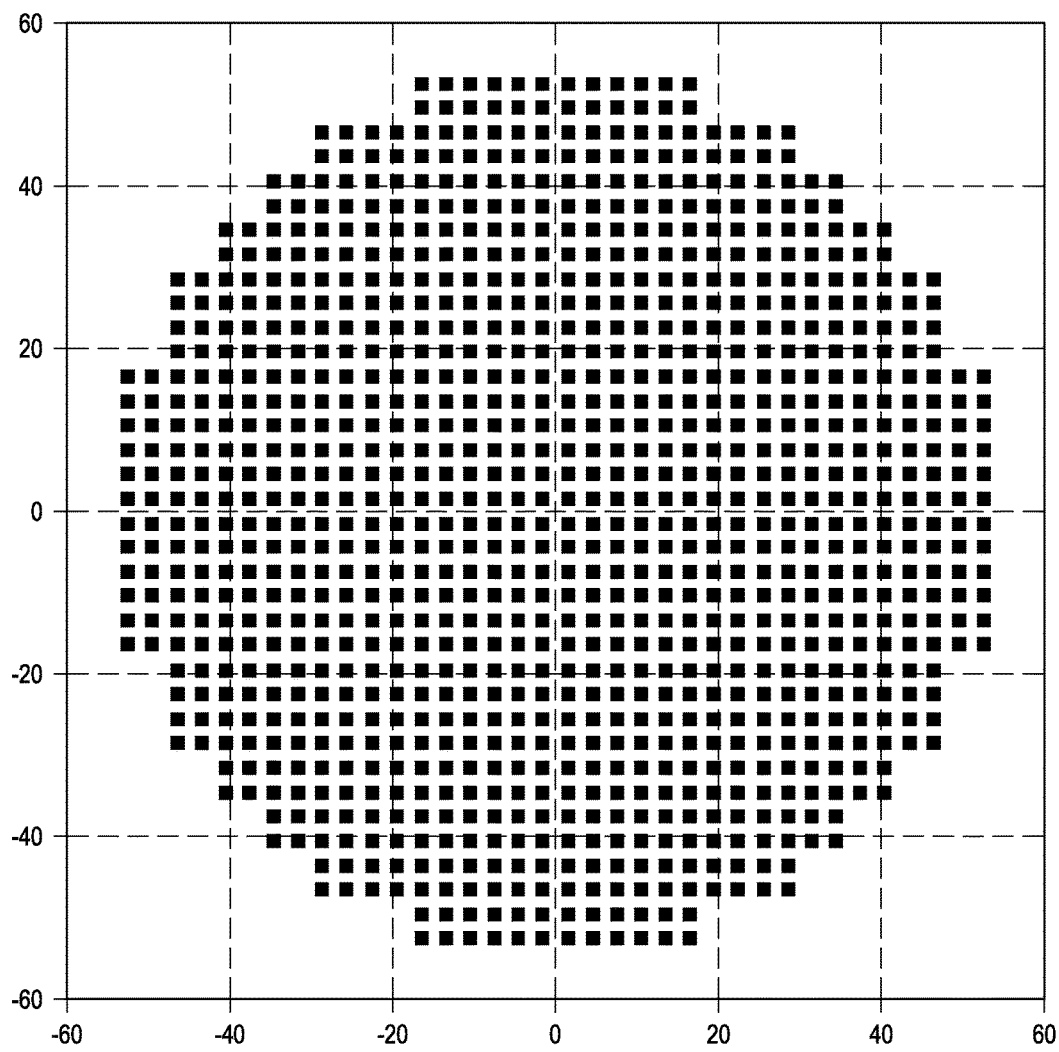
FIG. 3 shows an example of a circular constellation in accordance with various embodiments.

In some embodiments, the bit inverter 218 may include one or more look-up tables that facilitate symbol and/or bit selection for effective peak reduction. In some embodiments of the PAPR circuitry 104, the target PAPR may be set based on the modulation method employed by the transmitter 102. For example, different target PAPR values may be set for QAM versus circular constellation. FIG. 3 shows an example of a circular QAM constellation. The bit inverter 218 may include different look-up tables to implement the different target PAPR values, and maximize peak reduction for each modulation method.

The transmitter 102 also includes a pilot signal generator 220 that provides a pilot signal for transmission to the receiver 106. The pilot signal may have a peak to average ratio that allows the pilot signal to avoid bit inversion in the PAPR reduction circuitry 104. For example, the pilot signal may include no peak amplitudes that exceed the threshold applied by the peak detector 216. In some embodiments, pilot signal is inserted into the symbol stream of the PAPR reduction 104 circuitry downstream of the symbol mapping 204 as shown in FIG. 2. The pilot symbols are provided to the peak detector 216 because inclusion of the pilot symbols in the symbol stream may affect peaks in the signal to be transmitted.

Data output by the PAPR circuitry 104 is provided to the symbol mapping logic 224, and the delayed error corrected data, including the bit(s) inverted by the bit inverter 218, are mapped to symbols. The symbol mapping logic 224 may be similar or identical to the symbol mapping logic 204. In some embodiments, a single instance of symbol mapping logic may be applied as symbol mapping logic 204 and 224.

The symbols generated by the symbol mapping logic 224 are provided to the transmit filter 210. The transmit filter 210 includes a root raised cosine (RRC) filter 206 that filters data output of the PAPR reduction circuitry 104 to reduce intersymbol interference. The transmit filter 210 may include other components and subsystems that have been omitted in the interest of clarity. For example, the transmit filter 210 may include an interpolator and resampling filter that resamples the output of the RRC filter 206. Data output from the transmit filter 210 is converted to analog, amplified by the power amplifier 208, and driven to one or more antennas for transmission to the receiver 106.

Figure 4:
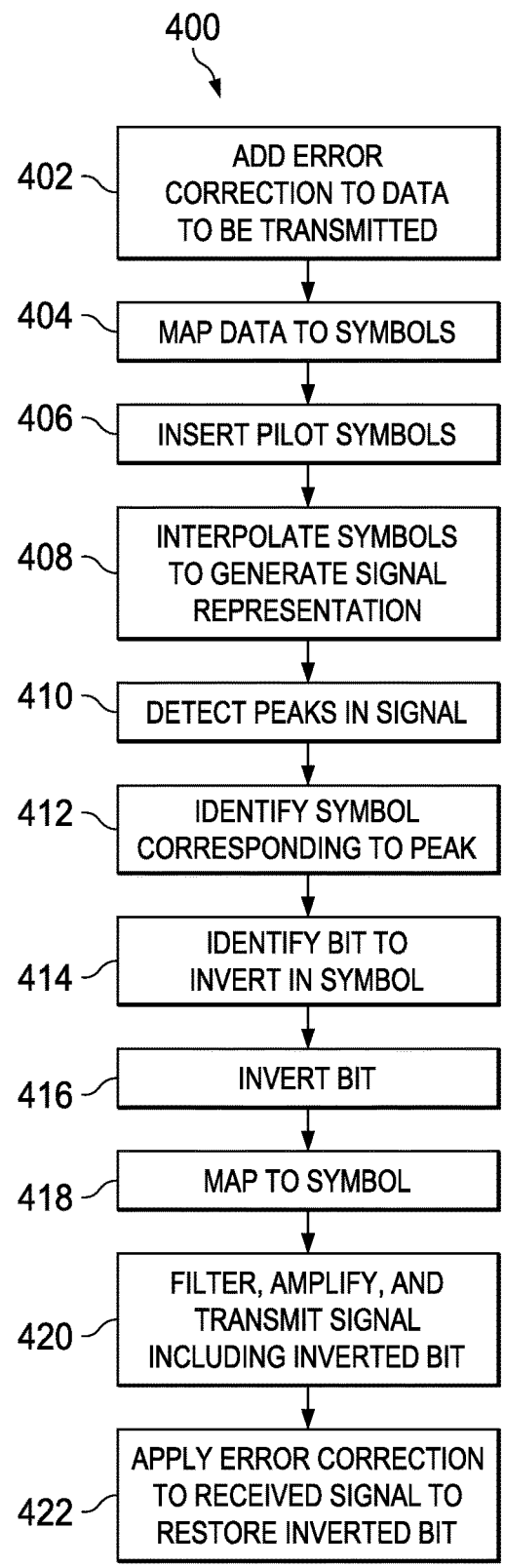
FIG. 4 shows a flow diagram for a method for reducing peak to average power ratio of transmitted signal in accordance with various embodiments.

FIG. 4 shows a flow diagram for a method for reducing peak to average power ratio of transmitted signal in accordance with various embodiments. Though depicted sequentially as a matter of convenience, at least some of the actions shown can be performed in a different order and/or performed in parallel. Additionally, some embodiments may perform only some of the actions shown.

In block 402, data to be transmitted is provided to the transmitter 102. Forward error correction coding is added to the data. The forward error correction encoded data is provided to the PAPR reduction circuitry 104 and mapped to symbols in block 404. For example, segments of the data may be mapped to points of a constellation.

In block 406, pilot symbols are inserted into the symbol stream provided to the interpolator 214.

In block 408, the interpolator 214 interpolates and filters the symbols produced in the symbol mapping, and the pilot symbols, to generate a representation of the signal to be transmitted. The interpolator 214 may replicate or approximate the processing applied to symbols by the transmit filter 210.

In block 410, the peak detector 216 identifies peak amplitudes of the signal to be transmitted as generated by the interpolator 214. The identified peak amplitudes may contain peak signal amplitudes that exceed a predetermined threshold amplitude applied by the peak detector 216. The peak detection may include application of a moving window that defines an interval in which a peak is identified.

In block 412, the data bits mapped to symbols by the symbol mapping logic 204 are stored while the symbol mapping, interpolation, and peak detection are performed. The peak detector 216 notifies the bit inverter 218 of a detected peak amplitude in excess of the predetermined threshold, and the bit inverter 218 identifies which bits of the stored (i.e., delayed) data correspond to the detected peak amplitude. For example, the bit inverter 218 may identify the bits mapped to the symbol nearest in time to the peak, or bits mapped to a symbol for which inversion of a bit(s) maximizes reduction of the identified peak or minimizes the symbol power.

In block 414, the bit inverter 218 selects one or more bits to invert in the identified symbol corresponding to the detected peak amplitude. The bit may be selected to maximize reduction of amplitude of the signal to be transmitted, to minimize peak power, and/or to minimize symbol power. The bit inverter 218 inverts the selected bit of the identified symbol in block 416.

In block 418, the delayed data stream, including the bit(s) inverted by the bint inverter 281, are mapped to symbols. The symbols are passed, in block 420, to transmit filter 210, and thereafter to digital-to-analog converters and to the power amplifier 208 for amplification and transmission to the receiver 106.

In block 420, the receiver 106 receives the signal transmitted by the transmitter 104. Forward error correction logic in the receiver detects and corrects the bit(s) inverted by the bit inverter 218 prior to transmission.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A wireless communication system, comprising:
a radio frequency wireless transmitter, comprising:
    signal peak reduction circuitry configured to reduce peak to average power ratio of a signal to be transmitted by reducing amplitude of the signal to be transmitted that is greater than a predetermined amplitude, the signal peak reduction circuitry comprising:

a bit inverter configured to:
  select a bit of a symbol to invert according to a forward error correction code of the signal such that inversion of the bit reduces the amplitude of the signal; and
  invert the selected bit of the symbol.

2. The system of claim 1, wherein the signal peak reduction circuitry further comprises a peak detector configured to detect amplitude values in the signal to be transmitted that exceed the predetermined amplitude.

3. The system of claim 1, wherein the signal peak reduction circuitry further comprises an interpolator configured to generate a representation of the signal to be transmitted based on the symbols to which data to be transmitted is mapped.

4. The system of claim 1, wherein the signal peak reduction circuitry further comprises delay logic configured to delay propagation to the bit inverter of each symbol of the signal to be transmitted for at least as long as is needed to determine whether the symbol causes the amplitude of the signal to be transmitted to exceed the predetermined amplitude.

5. The system of claim 1, wherein the signal peak reduction circuitry further comprises windowing logic that applies a moving window to the signal to be transmitted, and ensures that bit inversion is applied to only a single peak within the window.

6. The system of claim 1, wherein the bit inverter is configured to select the bit to invert to be a bit of a symbol closest in time to a detected peak of the signal to be transmitted.

7. The system of claim 1, wherein the bit inverter is configured to select the bit to invert such that inversion of the bit maximizes reduction of amplitude of the signal to be transmitted.

8. The system of claim 1, wherein the bit inverter is configured to:
  select the bit to invert such that inversion of the bit maximizes distance between the symbol and a symbol generated as a result of the inversion; or
  select the bit to invert such that the symbol is farther from zero than the symbol generated as a result of the inversion.

9. A method for reducing peak to average power ratio in a wireless communication system, comprising:
  detecting amplitude values in a signal to be transmitted that exceed a predetermined amplitude;
  selecting a bit of a symbol to invert according to a forward error correction code of the signal such that inversion of the bit reduces the amplitude of the signal; and
  inverting the selected bit of the symbol.

10. The method of claim 9, further comprising interpolating symbols mapped to the signal to be transmitted to generate a representation of the signal to be transmitted.

11. The method of claim 9, further comprising delaying propagation of each symbol of the signal to be transmitted, for inverting, for at least as long as is needed to determine whether the symbol causes the amplitude of the signal to be transmitted to exceed the predetermined amplitude.

12. The method of claim 9, further comprising applying windowing to ensure that within a predetermined window interval, bit inversion is applied to only a single peak of the signal to be transmitted.

13. The method of claim 9, wherein selecting the bit to invert further comprises selecting the bit to invert to be a bit of a symbol closest in time to a detected peak of the signal to be transmitted.

14. The method of claim 9, wherein selecting the bit to invert further comprises selecting the bit to invert such that inversion of the bit maximizes reduction of amplitude of the signal to be transmitted.

15. The method of claim 9, wherein selecting the bit to invert further comprises selecting the bit to invert such that, relative to the symbol, power of a symbol produced as a result of the inversion is reduced.

16. A transmitter comprising:
  signal peak reduction circuitry configured to reduce peak to average power ratio of a signal to be transmitted by reducing amplitude of the signal to be transmitted that is greater than a predetermined amplitude, the signal peak reduction circuitry comprising:
    an interpolator configured to generate a representation of the signal to be transmitted based on symbols to which data to be transmitted is mapped;
    a peak detector configured to detect, based on the representation of the signal, amplitude values in the signal to be transmitted that exceed the predetermined amplitude; and
    a bit inverter configured to:
      invert a bit of a symbol identified as causing the amplitude of the signal to exceed the predetermined amplitude; and
      select a bit of a symbol to invert according to a forward error correction code of the signal such that inversion of the bit reduces the amplitude of transmitted signal; and
      invert the selected bit of the symbol.

17. The transmitter of claim 16, further comprising a delay element configured to delay propagation to the bit inverter of each symbol of the signal to be transmitted for at least as long as is needed for the peak detector to determine whether the symbol causes the amplitude of the signal to be transmitted to exceed the predetermined amplitude.

18. The transmitter of claim 16, further comprising windowing logic that applies a moving window to the signal to be transmitted, and ensures that bit inversion is applied to only a single peak within the window.

19. The transmitter of claim 16, wherein the bit inverter is configured to select the bit to invert to be at least one of: a bit of a symbol closest in time to a detected peak of the signal to be transmitted; a bit that when inverted maximizes reduction of amplitude of the signal to be transmitted; and a bit that when inverted produces a symbol of lower power than the symbol containing the uninverted bit.

20. The transmitter of claim 16, further comprising a pilot signal generator configured to generate a pilot signal having peak to average power ratio such that the signal peak reduction circuitry inverts no bits of the pilot signal.

* * * * *